United States Patent [19]

Scifres et al.

[11] 4,328,469

[45] May 4, 1982

[54] HIGH OUTPUT POWER INJECTION LASERS

[75] Inventors: Donald R. Scifres, Los Altos; Robert D. Burnham; William Streifer, both of Palo Alto, all of Calif.

[73] Assignee: Xerox Corporation, Stamford, Conn.

[21] Appl. No.: 181,311

[22] Filed: Aug. 25, 1980

Related U.S. Application Data

[63] Continuation-in-part of Ser. No. 3,312, Jan. 15, 1979, abandoned.

[51] Int. Cl.$^3$ ............................................. H01S 3/19
[52] U.S. Cl. ..................................... 372/45; 357/17; 372/48
[58] Field of Search .................... 331/94.5 H; 357/18

[56] References Cited

U.S. PATENT DOCUMENTS 4,063,189  12/1977  Scifres et al. .................. 331/94.5 H

OTHER PUBLICATIONS

H. C. Casey, Jr. et al., "GaAs-Al$_x$G$_{1-x}$As Heterostructure Laser With Separate Optical and Carrier Confinement", *J. of Applied Physics*, vol. 45, No. 1, Jan. 1974, pp. 322-332.

D. R. Scifres et al., "Leaky Wave Room-Temperature Double Heterostructure GaAs:GaAlAs Diode Laser", *Applied Physics Letters*, vol. 29, No. 1, Jul. 1, 1976, pp. 23-25.

*Primary Examiner*—James W. Davie
*Attorney, Agent, or Firm*—W. Douglas Carothers, Jr.

[57] ABSTRACT

In a heterostructure injection laser having an active layer sandwiched by a pair of intermediate index layers, a very thin low refractive index and high bandgap may be employed between at least active layer and one intermediate layer or at least contiguous with a surface of at least one intermediate layer remote from the active layer. These thin layers may be applied in various positional combinations to produce desired effects on fundamental mode guiding.

26 Claims, 23 Drawing Figures

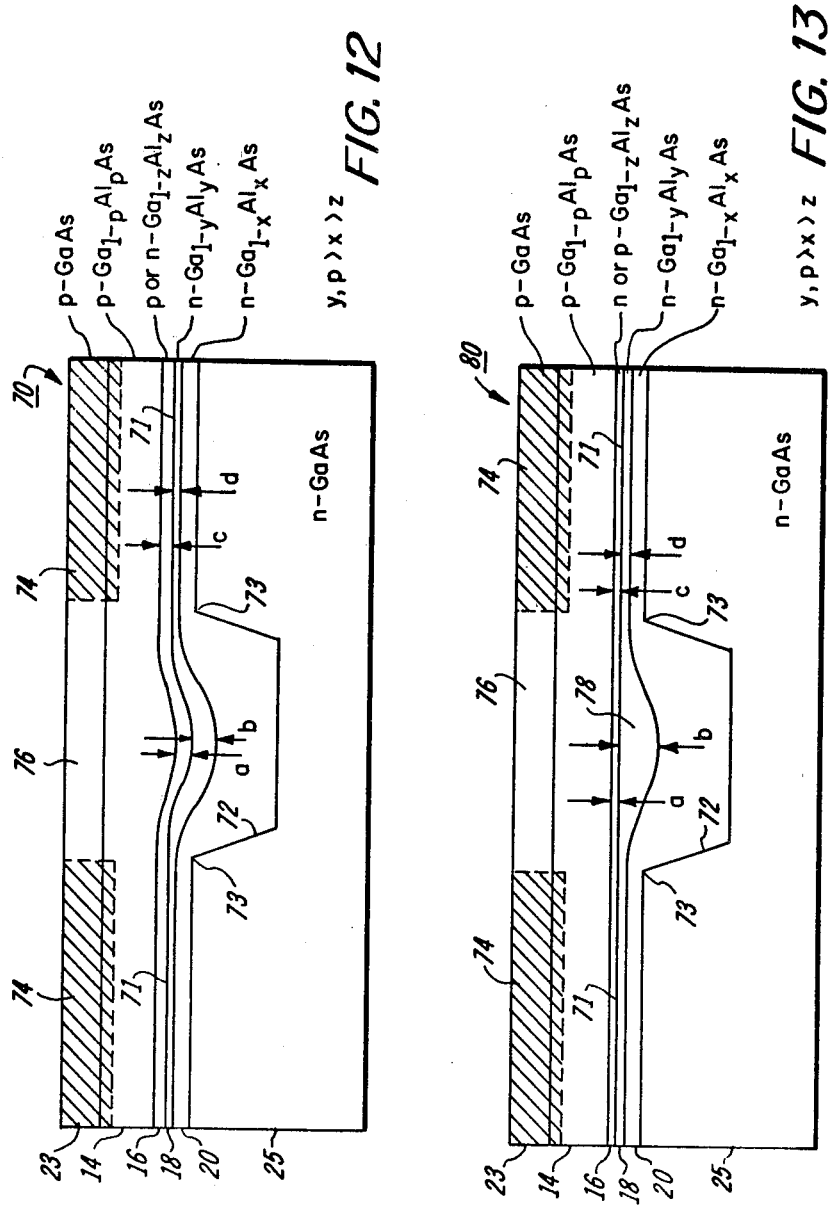

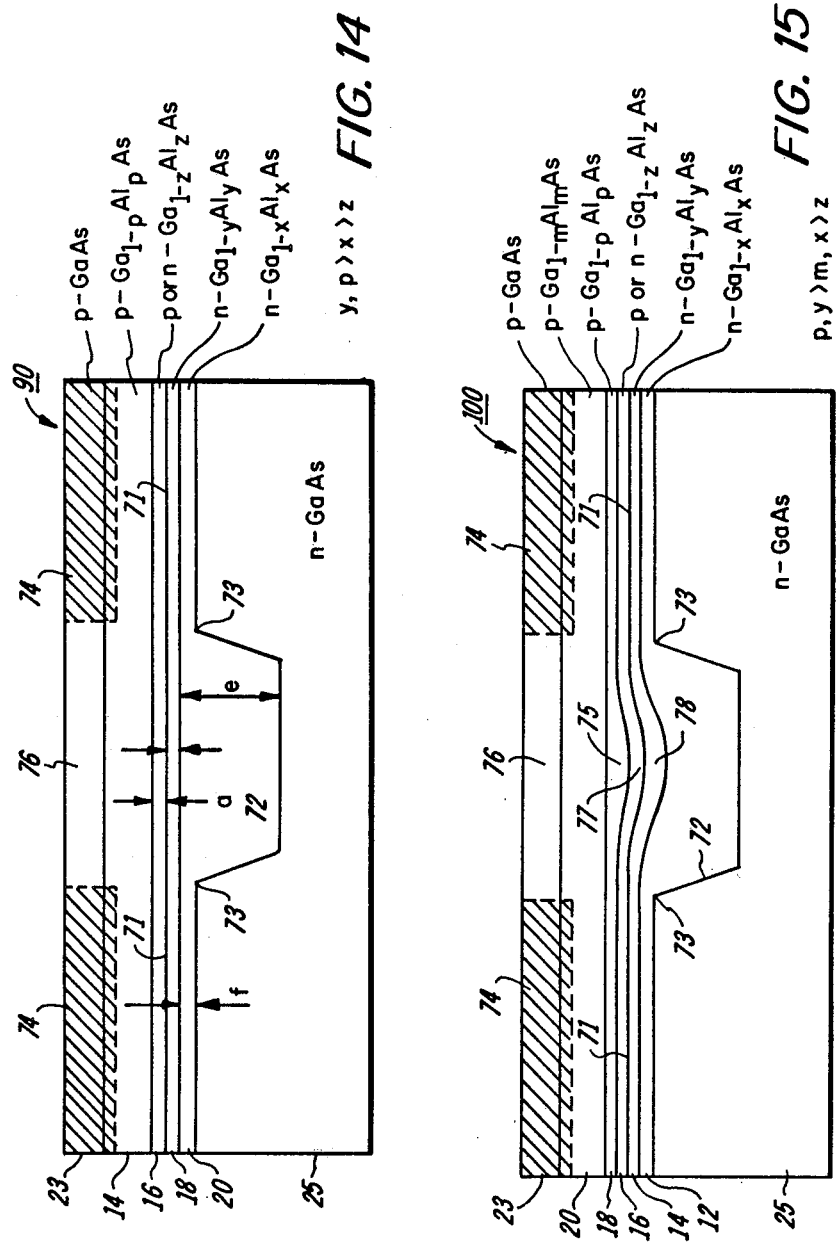

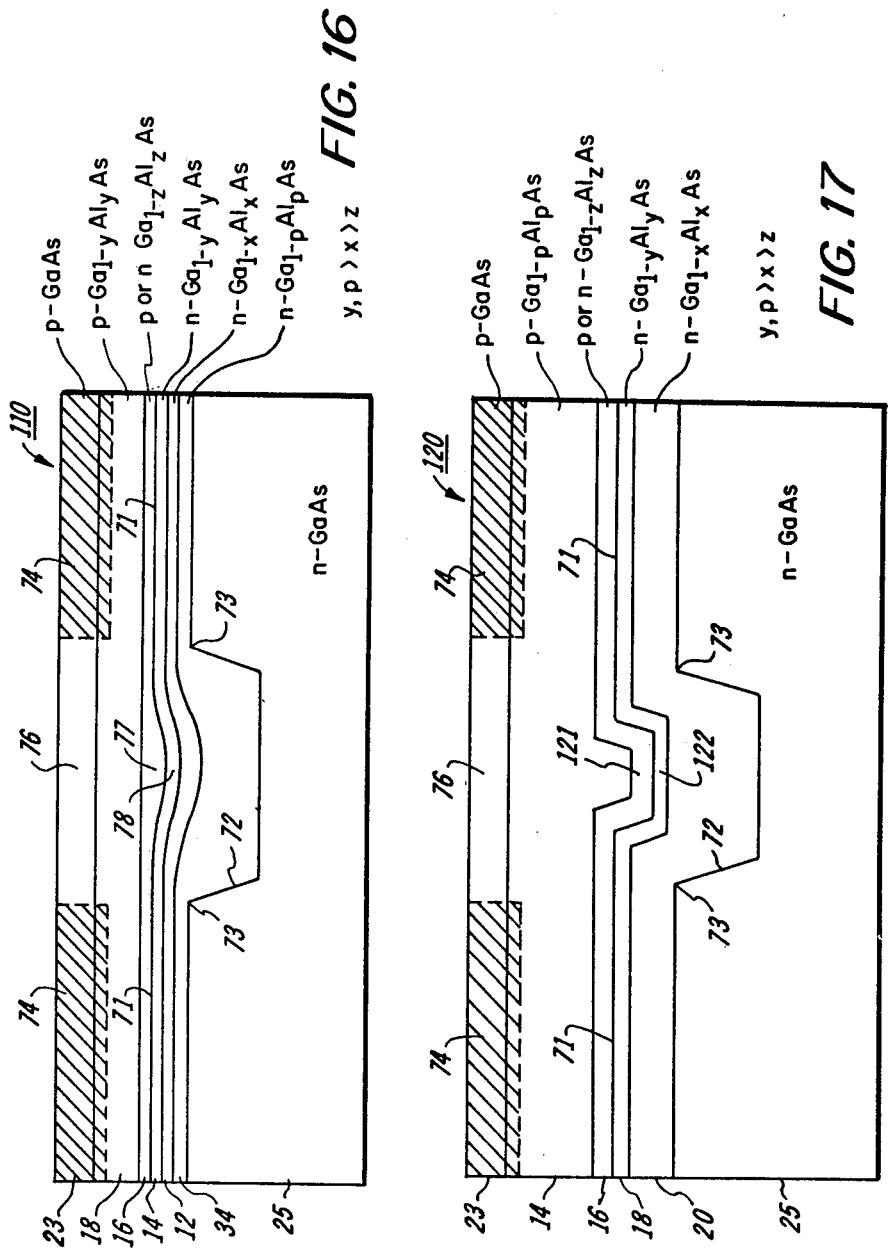

HIGH OUTPUT POWER INJECTION LASERS

CROSS REFERENCE TO RELATED APPLICATION

This application is a continuation-in-part of U.S. Ser. No. 3,312 filed Jan. 15, 1979, now abandoned.

BACKGROUND OF THE INVENTION

This invention relates generally to injection semiconductor lasers and more particularly to heterostructure lasers having a unique composition profile providing a high power, low divergence beam.

In the past, five layer heterostructure lasers have been developed for high power, low beam divergence applications. One such device is disclosed by G.H.B. Thompson et al in the Journal of Applied Physics, Volume 47, page 1501 (1976). In these devices, the refractive index profile of the semiconductive layers of the device have been provided with monotonic step type of index profile with the central active layer being the highest refractive index. Specifically, the index profile would be, low-intermediate-high-intermediate-low, vertically through the device. Such a profile allows the optical wave to spread within the device to create a low beam divergence. However, the laser also exhibits an increase in threshold because electrical carriers can be injected into the intermediate index layers rather than being completely confined to the higher index layer as is desirable.

Low beam divergence in the far field pattern may also be provided by a heterostructure injection laser having a very thin active layer. However, in order to confine the optical wave in its propagation in such a device, it is necessary to provide thick cladding layers adjacent to the active layer with high aluminum content. For example, the active layer may be GaAs and the cladding layers may be relatively thick layers of GaAlAs to confine the optical wave. These thick high aluminum content cladding layers lead to high overall thermal resistance thereby reducing the amount of possible input power which, in turn, limits the power outputs necessary for many low beam divergence applications.

OBJECT AND SUMMARY OF THE INVENTION

The primary object of this invention is the provision of a heterostructure laser having a unique refractive index profile that provides a lower beam divergence and a higher output power with overall lower thermal resistance than previously known in the art.

A heterostructure injection laser according to one embodiment of the present invention includes at least one cladding layer contiguous with one surface of the active layer of the laser and having a substantially lower index of refraction as compared to the active layer. The cladding layer has very thin cross-sectional thickness, the maximum thickness being sufficient to confine injection carriers to the active layer but permitting extension of the optical wave propagation beyond the cladding layer. A further layer is contiguous with the surface of the cladding layer remote from the active layer and having a relatively large thickness compared to the combined thickness of the cladding and active layers. This further layer is provided with an index of refraction intermediate of the active layer and the cladding so as to aid in guiding and confining the optical wave to its geometrical limit. The index of refraction of the further layers is chosen to be lower than the equivalent refractive index of the lowest fundamental mode of the guided optical wave.

A still further layer may be contiguous with the mentioned further layer having an index of refraction and layer thickness chosen to permit confinement of the lowest order or fundamental mode of the guided optical wave but permit absorption therein of higher order modes. In this case the refractive index of the further layer need only be lower than the refractive index of the active layer.

One or more of these layers, i.e., the active layer, the cladding layer, or the mentioned, further or still further layers may be made nonplanar to provide further single fundamental transverse mode control. A heterostructure injection laser according to another embodiment of the present invention has a refractive index profile that is intermediate-low-high-low-intermediate. The device is further characterized as having an active layer having a narrow bandgap and high refractive index sandwiched between two very thin, wide bandgap and low index cladding layers. This three layer structure is sandwiched between two comparatively thicker layers having a refractive index intermediate of cladding layers and the active layer. The intermediate layers may be provided with outer layers to provide for good mode confinement.

The thin cladding layers are thick enough to confine injected carriers but are sufficiently thin to allow and overall low thermal resistance and thereby allowing for higher input powers and corresponding higher output powers.

A heterostructure injection laser according to a further embodiment of the present invention has a refractive index profile that decreases in refractive index from the active layer to the outermost layers, which are contact layers and have higher index than the intermediate layers. The intermediate layers form what is referred to as a large optical cavity (LOC). A thin layer may be provided between the intermediate layers and the outermost layers to provide high optical loss for higher order transverse modes and low optical loss for the lowest order transverse modes, a prerequisite being that the refractive index of the outermost layers is greater than the equivalent refractive index of the fundamental mode of the guide optical wave propagating in the LOC.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 12 is a diagrammatic illustration of another heterostructure injection laser similar to that shown in FIG. 8 except fabricated on a channeled substrate forming nonplanar layers;

FIG. 13 is a diagrammatic illustration of another heterostructure injection laser similar to that shown in FIG. 12 except that the active layer is fabricated to be planar;

FIG. 14 is a diagrammatic illustration of another heterostructure injection laser similar to that shown in FIG. 12 except that both the active layer and adjacent cladding layer are fabricated to be planar;

FIG. 15 is a diagrammatic illustration of another heterostructure injection laser similar to that shown in FIG. 1 except fabricated on a channeled substrate forming nonplanar layers;

FIG. 16 is a diagrammatic illustration of another heterostructure injection laser similar to that shown in FIG. 10 except fabricated on a channeled substrate forming nonplanar layers;

FIG. 17 is a diagrammatic illustration of another heterostructure injection laser similar to that shown in FIG. 12 except fabricated by another type of growing technique.;

DESCRIPTION OF THE PREFERRED EMBODIMENT

Figure 1:
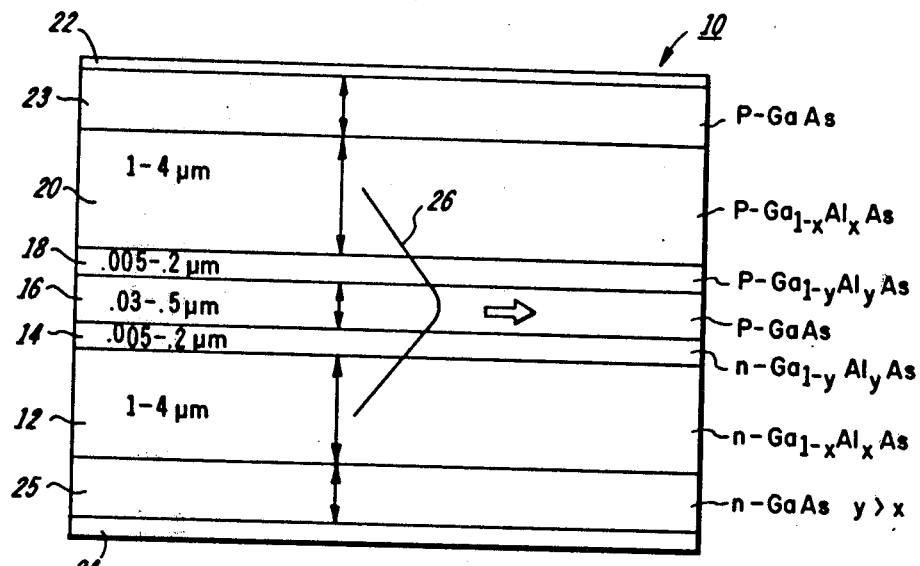
FIG. 1 is a diagrammatic illustration of a heterostructure injection laser according to one embodiment of the present invention.

In FIG. 1, the injection laser 10 is a heterostructure device comprising, in order, an additional or intermediate index layer 12, very thin cladding or confinement layer 14, active layer 16, very thin cladding or confinement layer 18, and an additional or an intermediate index layer 20. Layer 12 may be fabricated on a suitable substrate 25. Fabrication of these layers is best suited for MBE and CVD, as it is difficult to fabricate thin layers (such as layers 14, 18) of these semiconductor materials employing LPE techniques. However, LPE fabrication is possible in producing the behavior desired in the laser.

Composition of layers 12, 14, 16, 18 and 20 may be, respectively, n-$Ga_{1-x}Al_xAs$, n-$Ga_{1-y}Al_yAs$, p-GaAs, p-$Ga_{1-y}Al_yAs$, and n-$Ga_{1-x}Al_xAs$, where $y-x$. For example, intermediate layers 12 and 20 may be $Ga_{0.95}Al_{0.05}As$ of proper conductivity type and cladding layers 14 and 18 may be $Ga_{0.7}Al_{0.3}As$ of proper conductivity type. Contact facilitating layer 23 and substrate 25 may be, respectively, p-GaAs and n-GaAs. These layers provide a vehicle by which electrodes 22 and 24 may be applied to laser 10 to provide for its operation. Layers 23 and 25 might be eliminated if the Al content provided in the intermediate index layers 12 and 20 is of low value, e.g., below 10% Al or if electrical contacts can be made to higher Al content layers.

As is well known in the art, the conductivity types of these layers can be reversed. Also active layer 16 may have a low content of aluminum (Al) but such concentrations would be below Al concentrations of the intermediate layers 12 and 20.

As well known in the art, appropriate stripe geometries or transverse mode confining structures may also be added to this and all other embodiments disclosed herein to confine the current to a specific lateral region of the structure and to provide a lateral waveguide along the plane of the p-n junction.

Upon forward biasing with a potential applied to electrode 22 greater than that applied to electrode 24, carriers (holes and electrons) are injected into and confined within the active layer 16 by thin cladding layers 14 and 18 and upon carrier recombination, produce radiation which provides an optical wave 26 which has a wide profile and spreads out into intermediate layers 12 and 20.

Examples of possible layer thicknesses are shown in FIG. 1.

Cladding layers 14 and 18 are very thin compared to intermediate layers 12 and 20. Cladding layers 14 and 18 may be approximately 50A to 2000A thick and active layer 16 may be approximately 200A to 5000A thick. In general, the thicknesses of these cladding layers is governed by performance parameters. They, however, should not be so thin as to permit carriers to generally tunnel through the thin layer into the intermediate index layers 12 and 20.

Figure 2:
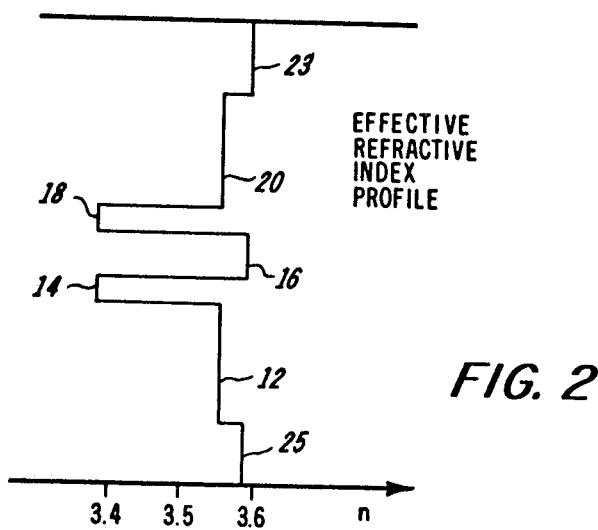
FIG. 2 is a refractive index profile for the laser structure of FIG. 1.

The refractive index profile for laser 10 is shown in FIG. 2. Sections of the profile having identical numerical identification for corresponding layers in FIG. 1 and each section represents the effective index of refraction level for the corresponding layer composition. The index profile is intermediate-low-high-low-intermediate. The advantage to be obtained by this index profile is that the injected carriers are confined by the thin wide bandgap cladding layers 14 and 18 on either side of the low bandgap active layer 16 while the optical wave 26 is confined by the thick intermediate index layers 12 and 20. Optical confinement is provided mainly by the comparatively thick intermediate index layers 12 and 20 because the low index cladding layers are designed to be too thin in cross-sectional thickness to confine the optical wave. Thus, the optical wave spreads deeply into these intermediate index layers, which are designed to have a slightly lower refractive index than the equivalent refractive index of the guided wave 26.

Because the fundamental mode is guided within a larger optical cavity, i.e., the outer limits of layers 12 to 20, the optical power is spread across a large width which yields a low beam divergence in the far field pattern. The beam divergence angle may be approximately 10° to 20° at one-half power points in the far field pattern. Also by spreading the optical power, lower power densities are incident per unit area on the mirrors. This permits laser operations at higher power levels before mirror damage occurs.

Another advantage of this structure is that the overall thermal resistance of laser 10 is low. The temperature rise per watt input of power is lower than comparative devices known in the art, for example, 10°-15° C./watt. The layers of highest thermal resistance are the carrier confinement layers 14 and 18. However, these layers being quite thin, do not provide high levels of thermal resistance. Good current confinement is provided since the energy barrier for injected carriers in active layer 16 are many times greater than the thermal temperature. The overall temperature rise of laser 10 is low because the overall lower thermal resistance is low, allowing for higher input powers and, consequently, larger output power levels.

Thus, higher power output levels may be achieved without mirror damage and high thermal resistance while improving carrier confinement to the active layer of the laser.

Figure 3A:
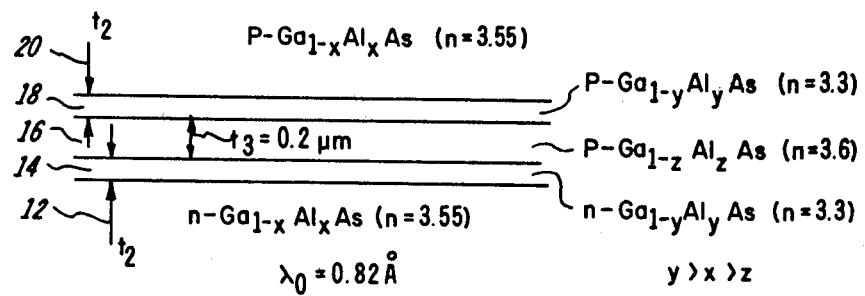
FIG. 3(a) is a diagrammatic view of the central layers of the laser of FIG. 1 to illustrate layer thickness and refractive index relationships.

In order to demonstrate the behavior of this laser, a specific set of layer thicknesses and indices are shown schematically in FIG. 3(a).

In this example, the laser is provided with an active region 16 composed of p-$Ga_{1-z}Al_zAs$ (n=3.6) with a thickness of 0.2 μm is cladded on either side by p and n type $Ga_{1-y}Al_yAs$ whose refractive index is chosen to be 3.3 (z<y). Outside of these high aluminum cladding layers, low aluminum content layers 20 and 12 are added as in the case of FIG. 1. The refractive index of these layers is 3.55.

Figure 3B:
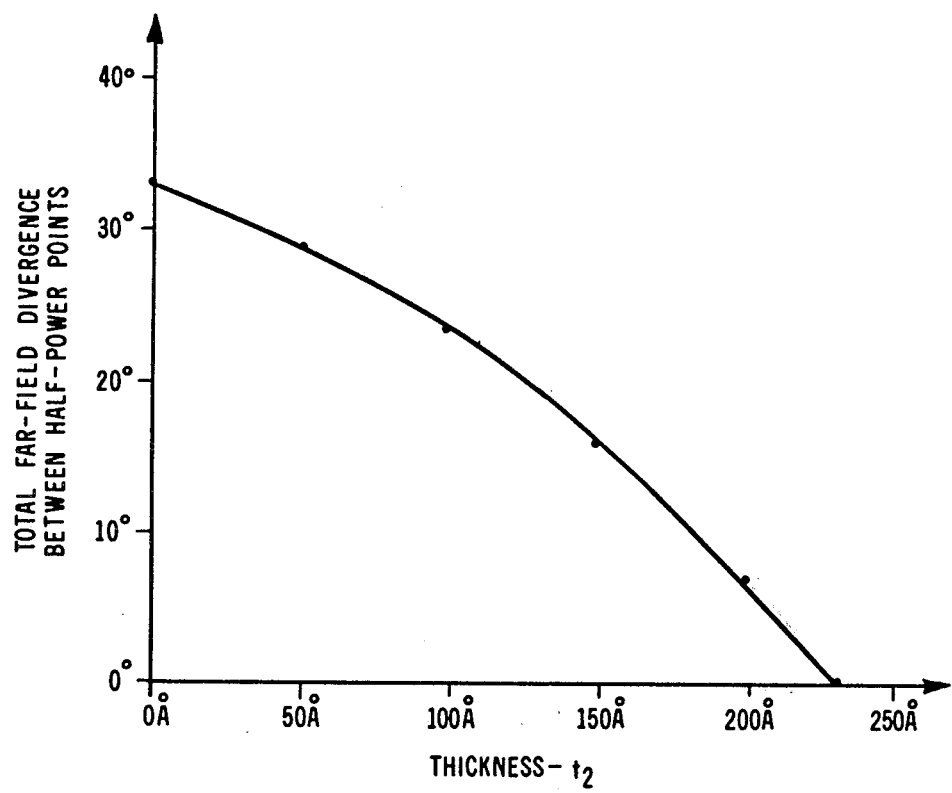
FIG. 3(b) is a graphic illustration of the far field divergence, in degrees, as a function of cladding layer thicknesses.

Plotted in FIG. 3(b) is the approximate dependence of the laser far field divergence, in degrees, as a function of the thickness of layers 14 and 18, designated as $t_2$. As shown, the beam divergence goes from approximately 33° to 0° as the thickness, $t_2$, increases. Beyond a thickness of about 255A, the equivalent refractive index of the guided wave 26 becomes lower than the index of layers 12 and 20 and the mode begins to radiate power into these particular layers. This will lead to a collimated (prism coupled) output beam. Such a beam may or may not be desirable depending on the device application. If not desired the mode may be fully confined by the addition of two more layers as will be shown subsequently in FIG. 4.

The example presented in FIG. 3 provides some insight into the variations in device behavior based on layer thickness and refractive index.

It should be mentioned that numerous other possibilities for the device design also exist. A wide range of layer thicknesses and indices may be employed and those presented in FIGS. 1 and 3 are only intended to indicate possible thickness and composition ranges. Also, this example is applicable for lasers having only one cladding layer, such as, disclosed in FIG. 8.

The point is that, in the design of these lasers, one must calculate the equivalent refractive index of the guided wave 26, based on thicknesses and indices of the layers and compare it to that of layers 12 and 20 to determine whether a guided wave or radiating wave exists in the waveguide structure of the laser. From such a calculation, threshold, and near and far field patterns are also readily obtainable.

In other words, the structure is designed in a manner to best prevent radiation losses, calculating to determine that the equivalent refractive index of the fundamental mode 36 is higher than the refractive index of intermediate layers 12 and 20.

A further variation possible in the embodiments disclosed herein is that the small refractive index differences between the active layer 16 and layers 12 and 20 may be provided by a doping level change rather than actual composition changes in these layers, i.e., an Al content change. A still further possibility is that although the layers are shown with step changes in index, a graded index profile could also be employed. A still further variation is that asymmetric variations in layer thickness and/or refractive index may be employed relative to one or both layers 14 and 18, and these layers need not be identical in compositional and optical properties in the performance of their function. A still further variation is that although the invention is described in terms of GaAs/GaAlAs materials any other semiconducting materials such as In, Ga, As, P, Sb, Al, Pb, Sn, Se and Te can be used.

These variations apply equally to the other structures disclosed herein having only one thin cladding layer.

Figure 4:
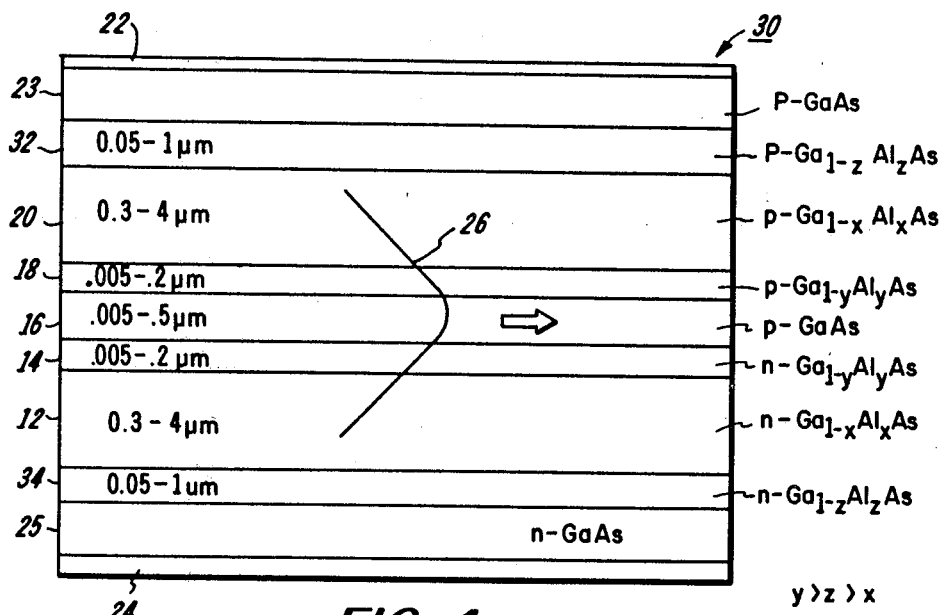
FIG. 4 is a diagrammatic illustration of another heterostructure injection laser according to the FIG. 1 embodiment, having a pair of outer thin layers for mode confinement and control.

In FIG. 4, laser 30 is substantially identical to laser 10 of FIG. 1 except for the provision of additional confinement layers 32 and 34 between intermediate index layers 12 and 20 and contact facilitating layers 23 and 25. These layers are provided at the outer boundaries of intermediate layers 12 and 20 and provide for improved optical confinement. Layers 32 and 34 may be fabricated by growth techniques referred to previously.

Figure 5:
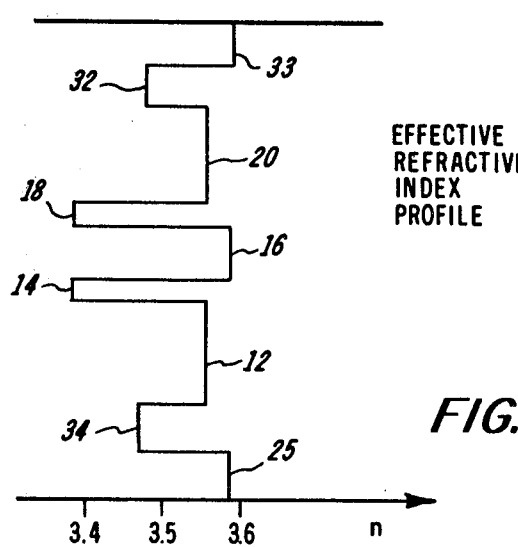
FIG. 5 is a refractive index profile for the laser structure of FIG. 3.

As noted in FIG. 5, the refractive index for layers 32 and 34 in the index profile is lower than that of intermediate layers 12 and 20. Although shown to be higher than the index for cladding layers 14 and 18, the index of layers 32 and 34 might also be lower. The difference in effective refractive index between layers 32 and 34 and adjacent layers 12 and 20 should be sufficient to improve optical confinement of optical wave 26 and its propagation to the dimensional extent of layers 12 and 20. These outer layers 32 and 34 may also be made quite thin, such as, 1000A or less, in order to suppress higher order mode oscillations.

The structures as shown thus far have been presented as being symmetric with respect to both thickness and composition on either side of the active layer 16 of the laser. This is not an absolute necessity since the device can be designed to be asymmetric in either or both thickness and material composition, as shown in FIGS. 6 and 7.

Figure 6:
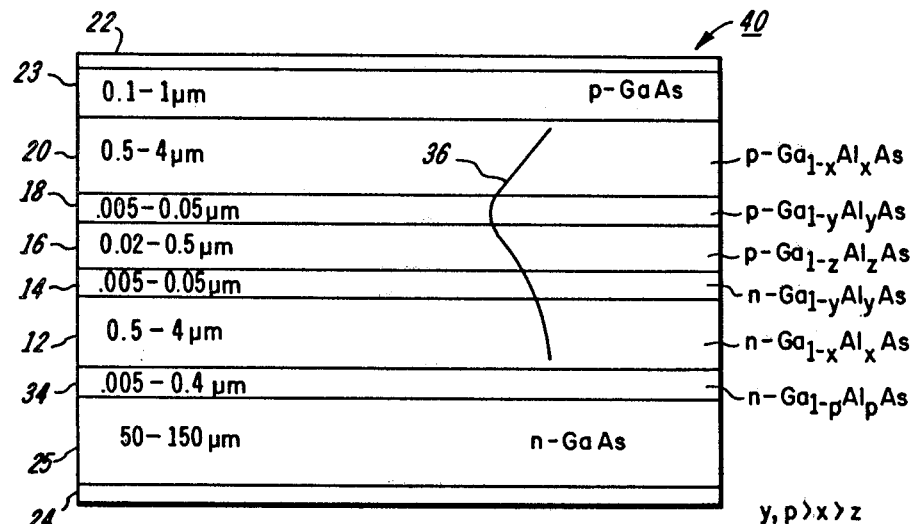
FIG. 6 is a diagrammatic illustration of still another heterostructure injection laser according to the FIG. 1 embodiment designed for asymetrical operation.
Figure 7:
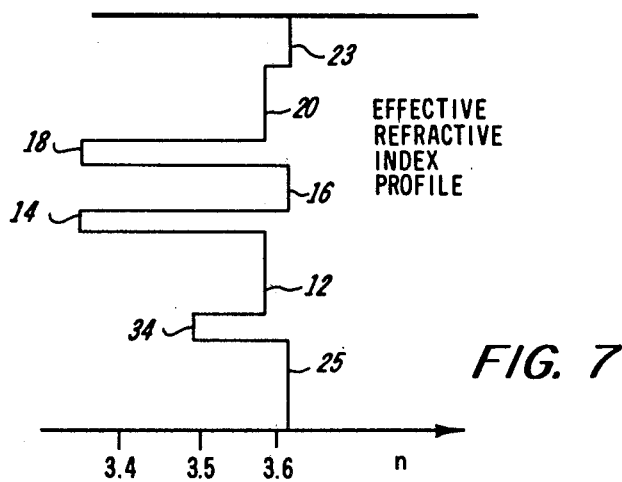
FIG. 7 is a refractive index profile for the laser structure of FIG. 6.

In FIG. 6, laser 40 is substantially identical to laser 30 of FIG. 4 except that layer 32 has been omitted, making this region of the structure similar to laser 10 of FIG. 1. This design is, therefore, representative of a combination of lasers 10 and 30.

As shown, the optical wave 36 will propagate asymmetrically relative to active layer 16.

Alternatively, layer 34 may be omitted rather than layer 32.

The heterostructure injection laser of previous embodiments may be provided with only one very thin cladding layer 14 or 18 rather than two such layers.

Figure 8:
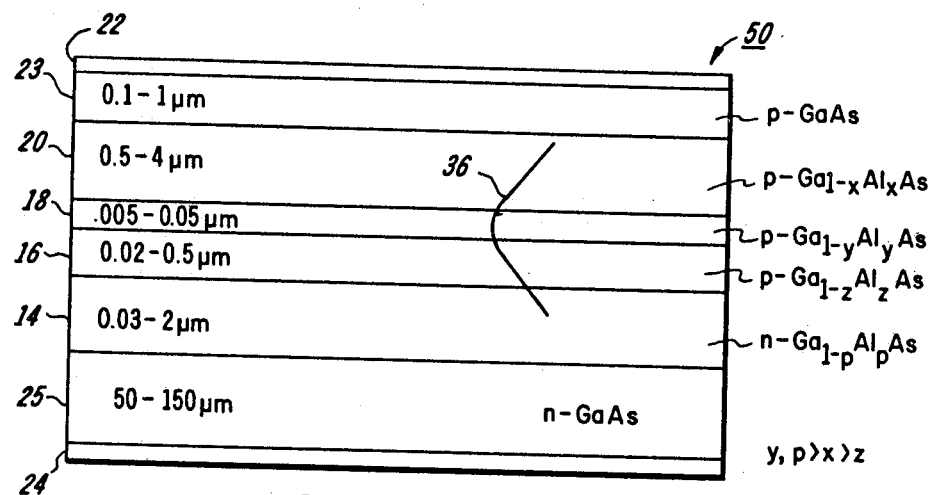
FIG. 8 is a diagrammatic illustration of a heterostructure laser according to another embodiment of the present invention.

This is illustrated in the injection laser 50 shown in FIG. 8. Full charge confinement to the active layer 16 is achieved, as well as desired waveguiding of the optical wave, in that, the wave is permitted to spread into intermediate layer 20. Layer 14 is provided to be thicker, that is, within a range of about 0.03 μm to 2.0 μm thick or possibly greater. The new guided wave profile 36 is obtained with center of wave propagation offset from the active layer, favoring a large amount of propagation in intermediate index layer 20.

The fundamental mode profile 36 will be nonlossy, that is, guided, as long as the equivalent refractive index, $n_{eq}$ of mode 36 is greater than the refractive index, $n_{20}$, of layer 20, as previously mentioned relative to injection lasers 10, 30 and 40. If index $n_{20}$ is greater than index $n_{eq}$, layer 20 will act as leaky waveguide permitting radiation to radiate away from the optical cavity in a manner similar to that illustrated in U.S. Pat. No. 4,063,189.

The equivalent refractive index of mode 36 is a weighted average of the refractive indices of layers 14, 16, 18 and 20, depending on both the thickness and refractive index of each layer.

Figure 9:
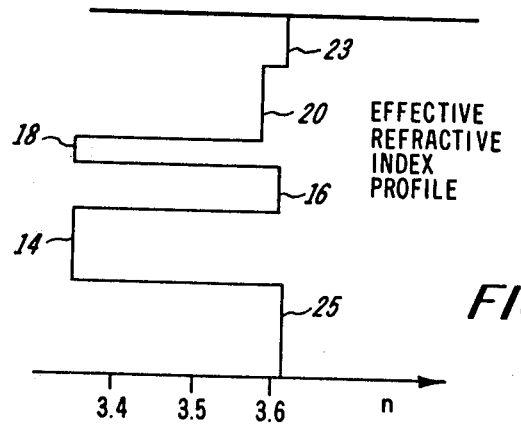
FIG. 9 is a refractive index profile for the laser structure of FIG. 8.

FIG. 9 shows the refractive index profile for the layers 14, 16, 18, 20, 23 and 25. Note that the active layer 16 in this structure as well as others to be disclosed may be p or n type $Ga_{1-z}Al_zAs$ or GaAs or other semiconducting laser material.

As a specific example, the following Table I shows thickness and aluminum content that might be used for layers in injection laser 50.

TABLE I

| Layer | Thickness (μm) | AlAs Content |
|-------|----------------|--------------|
| 14    | 2.0            | p = 0.30     |
| 16    | 0.3            | z = 0.05     |
| 18    | 0.005          | y = 0.25     |
| 20    | 3.0            | x = 0.18     |

In this example, p is greater than y. However, p may also be less than or equal to y. The primary condition is that the equivalent refractive index, $n_{eq}$, of mode 36 be greater than the refractive index, $n_{20}$, of layer 20 in order to achieve lossless waveguiding.

Laser 50 may be optimized to allow only fundamental mode operation. As the fundamental mode nears cutoff, that is, as the equivalent refractive index, $n_{eq}$, approaches the refractive index, $n_{20}$, of layer 20, the higher order modes of the laser 50, will become lossy (unguided) and require greater laser gain in order to propagate in the established laser cavity.

Figure 10:
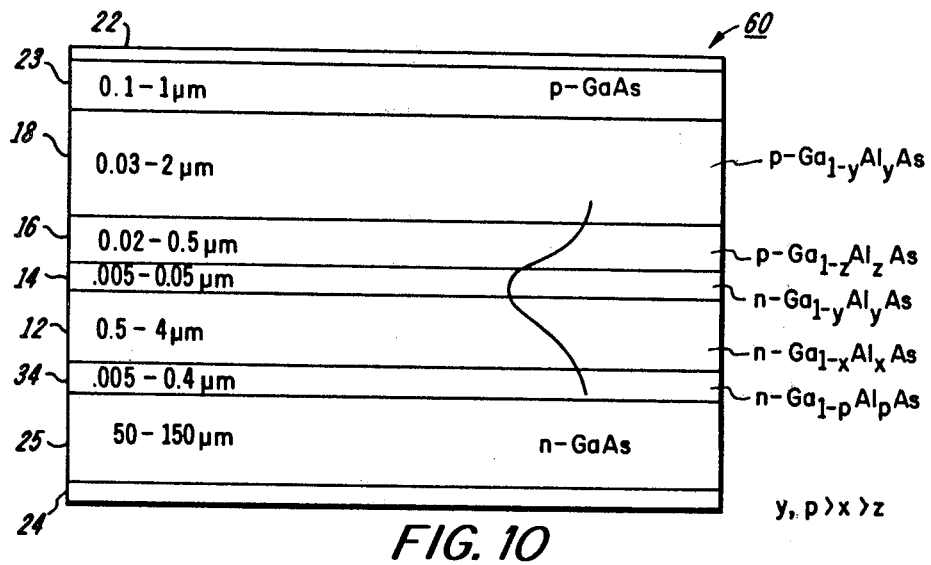
FIG. 10 is a diagrammatic illustration of another heterostructure injection laser according to the FIG. 8 embodiment having an outer thin layer for better mode confinement and control.

In FIG. 10, injection laser 60 is provided with a cladding layer 14 that is very thin, i.e., less than 0.05 μm, while layer 18 is comparatively much thicker. Confinement layer 34 is also included to provide more stable waveguiding, that is, to improve optical confinement of the fundamental mode 36 as well as suppress the oscillation of higher order modes. Layer 34 is fabricated to be thin enough (0.005-0.4 um) so that higher order modes will radiate into substrate layer 25, which is lossy. This radiation loss will exceed their gain and they will not be able to oscillate. Only a very small portion of the fundamental mode 36 will extend into this loosy layer.

Figure 11:
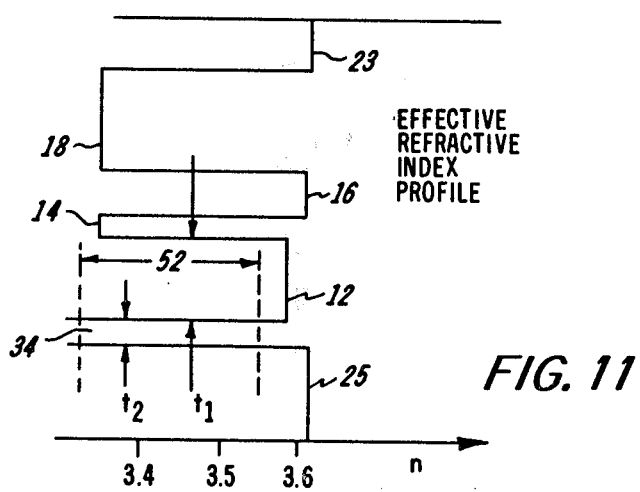
FIG. 11 is a refractive index profile for the laser structure of FIG. 10.

FIG. 11 illustrates the index profile for laser 60. The aluminum content and thickness of layer 34 are chosen to provide optimized mode filtering, i.e., permit confinement of the lowest order mode and allow absorption (radiation) of higher order modes into the lossy substrate layer 25. Optimization can be achieved for a given correlation between the aluminum content (represented by a change in the refractive index within the limit of arrow 52) of this layer and its thickness, $t_2$. Once having the desired aluminum content to layer thickness, a corresponding respective decrease or increase in aluminum content would require a respective increase or decrease in the layer thickness.

The laser structures thus far discussed have all been planar structures, i.e., all contiguous layers of the device are planar throughout the structures. However, one or more of these layers may be nonplanar toward achievement of fundamental transverse mode control. Nonplanar structuring may be achieved by employing a channeled substrate upon which the layers are sequentially, epitaxially deposited by growth methods, such as, liquid phase epitaxy (LPE), molecular beam epitaxy (MBE) and metalorganic chemical vapor deposition (MOCVD). In addition, other methods of nonplanaring such as chemical etching, ion implantation diffusion, growth through a mask, growth on a nonplanar substrate, can be used. FIGS. 12-16 illustrate structures fabricated by LPE growth on a substrate channel while FIG. 17 illustrates a structure employing MOCVD growth. Basic structures are shown without conventional contacts.

The channel substrate nonplanar (CSNP) laser 70 shown in FIG. 12 is guite similar in layer content to laser 50 in FIG. 8, except that the order and conductivity type of layers 14, 18 and 20 have been reversed. Intermediate aluminum content layer 20 is initially deposited on substrate 25, followed by epitaxial deposition of layers 18, 16, 14 and 23. Since an etched groove or channel 72 is present in the surface of substrate 25, both the active layer 16 and the heterolayers 18 and 20 are deposited via LPE forming nonplanar regions over the channel 72. The manner of accomplishing this layer nonlinearity is now well known in the art.

Current confinement may be provided in any conventional manner. In the structures shown, ion or proton implanted regions 74 are provided parallel to the channel 72 for the length of the laser to provide a current channel 76.

The index profile of FIG. 9 is applicable to injection laser 70 if the layers designation is reversed.

The enlarged regions 77 and 78 in layers 16 and 18 provide fundamental transverse mode control laterally along the plane of the p-n junction 71 whereas the employment of thin cladding layer 18 is of high aluminum content contiguous with thicker intermediate layer 20 provides fundamental transverse mode control perpendicular to the plane of the p-n junction 71. The fundamental mode in the plane of the p-n junction 71 is guided at the thickest region 77 of the active layer 16 while higher order modes radiate and have high losses at the edges 73 of the channel 72 whereby lowest order mode operation is established and maintained.

A typical example for aluminum content and layer thickness for laser 70 is shown in Table II. The channel width between edges 73 is about 5 μm wide.

TABLE II

| Layer | Thickness (A) above channel | Thickness (A) adjacent channel | AlAs Content |
|-------|-----------------------------|--------------------------------|--------------|
| 14    |                             |                                | p = 0.50     |
| 16    | a = 800A                    | c = 600A                       | z = 0.05     |
| 18    | b = 3000A                   | d = 800A                       | y = 0.30     |

TABLE II-continued

| Layer | Thickness (A) above channel | adjacent channel | AlAs Content |
|---|---|---|---|
| 20 | | | x = 0.12 |

Laser 80 in FIG. 13 is identical to laser 70 of FIG. 12 except the epitaxial growth times are changed to permit layer 18 to grow until it is planar over channel 72. Thus, the growth of the active layer 16 will be planar. A typical example for aluminum content and layer thickness is shown in Table III. The channel width between edges 73 is, again, about 5 μm.

TABLE III

| Layer | Thickness above channel | adjacent channel | AlAs Content |
|---|---|---|---|
| 14 | | | p = 0.050 |
| 16 | a = 1000A | c = 1000A | z = 0.05 |
| 18 | b = 0.7 μm | d = 100A | y = 0.30 |
| 20 | | | x = 0.12 |

In FIG. 14, laser 90 is identical to laser 70 of FIG. 12 except the epitaxial growth times are changed to permit all layers to be planar and uniform over channel 72. Thus, layer 20 is grown until this layer is planar before the deposition of the remaining layers. Both the active layer 16 and the thin cladding layer 18 are of uniform thickness, whereas the intermediate aluminum content layer 20 is of nonuniform thickness due to channel 72.

A typical example of aluminum content and layer thickness is shown in Table IV. The channel width between edges 73 is about 5 μm.

TABLE IV

| Layer | Thickness above channel | adjacent channel | AlAs Content |
|---|---|---|---|
| 14 | | | p = 0.30 |
| 16 | a = 2500A | | z = 0.05 |
| 18 | b = 200A | | y = 0.30 |
| 20 | e = 1.5 μm | f = 0.2 μm | x = 0.12 |

Laser 100 in FIG. 15 is identical in layer aluminum content and layer deposition to laser 10 in FIG. 1. However, layers 18, 16 and 14 in regions 75, 77 and 78 are nonplanar due to growth over channel 72. Layers 18 and 20 have been designated to possibly contain a different aluminum content than layers 12 and 14. However, p may equal y and m may equal x. The aluminum content values exemplified in laser 10 may be employed in laser 100. Layer compositions and thicknesses are chosen to allow fundamental mode to be guided while higher order modes radiate due to their differing spatial overlap with the various layers 14, 16, 18 and 20.

Laser 110 in FIG. 16 is identical in layer aluminum content and layer deposition to laser 60 in FIG. 10. However, layers 12, 14 and 16 are nonplanar due to growth over channel 72. Confinement layer 34 is thin (less than 0.4 μm) in regions above edges 73 so that higher order modes will radiate into the substrate 25.

These channel substrate lasers may also be grown by MOCVD and MBE. The configuration for laser 120 shown in FIG. 17 is laser 70 of FIG. 12 except that the growth process is MOCVD. In this case, the growth characteristics are somewhat different from those observable by LPE The layers are not curved or rounded about the channel 72 but take on the geometric shape of the channel. In any case, nonplanar variations 121 and 122 in the layers 16 and 18, respectively, can be accomplished by MOCVD and MBE as well as providing spatially selectively absorbing layers to provide a laser structure that provides fundamental transverse mode control in directions both lateral and perpendicular to the p-n junction.

Other geometric configurations can be employed to act as lateral transverse mode controlling mechanisms, such as multichanneled substrates, substrate mesas, channeled mesa substrates, buried heterostructures, or nonuniform thickness layers grown through masks to obtain nonplanar, nonuniform thickness layers to achieve a high output power, transverse mode controlled laser.

In other words, the planar structures of FIGS. 1, 4, 6, 8 and 10 may be used with any known lateral mode controlling mechanism.

FIGS. 18-22 show various heterostructure injection lasers employing one or more outer, thin optical mode control layers 137 and/or 138. These layers essentially perform the function of layers 32 and/or 34.

Figure 18:
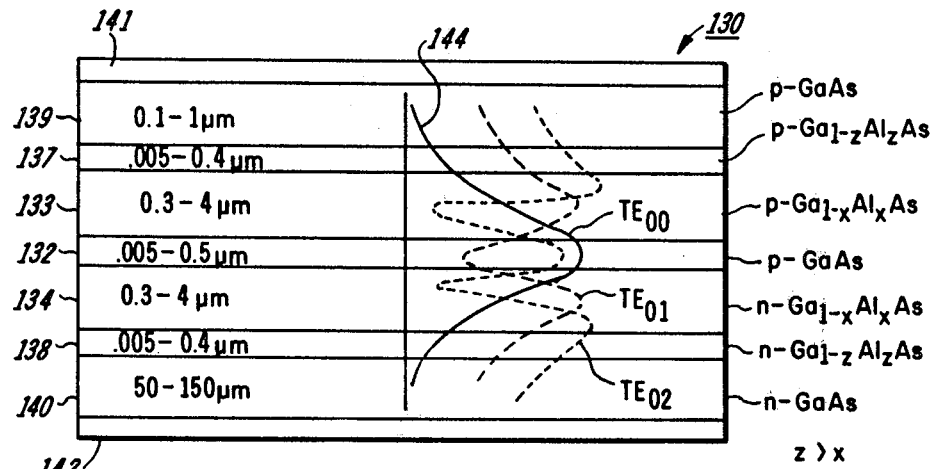
FIG. 18 is a diagrammatic illustration of a double LOC heterostructure injection laser having a pair of outer thin layers for mode confinement and control.

Laser 130 in FIG. 18 is a large optical cavity (LOC) injection laser, the general concept of which has been disclosed by G. H. B. Thompson in the *Journal of Applied Physics*, Volume 47 at page 150, et seq. (1976) and by H. C. Casey Jr. et al in the *Journal of Applied Physics*, Volume 45, No. 1 at page 322 et seq. In general, LOC laser 130 comprises an optical waveguide or cavity comprising active layer 132 and optical waveguide layers 133 and 134. These latter layers are bounded by cladding layers 137 and 138. Layers 133 and 134 have low aluminum content as compared to layers 137 and 138, i.e., are significantly of higher refractive index compared to layers 137 and 138 in order to sustain and be transparent to optical wave propagation. Normally layers 137 and 138 are much thicker in thickness than shown in FIG. 18. See Thompson and Casey, supra. They are bounded by contact and support layers 139 and 140 and metalizations 141 and 142.

Thus, laser 130 differs from the general LOC injection laser by having, thin outer layers 137 and 138 of 1000A or less are provided to suppress higher order mode oscillations, such as the $TE_{01}$ and $TE_{02}$ modes, while enhancing the confinement and providing low optical loss for the lowest order as fundamental transverse mode, $TE_{00}$. Higher order transverse modes will penetrate the thin low index layer and be absorbed (radiate) into the high refractive index layers 139 and 140 as indicated in FIG. 18. A not insignificant portion of the propagating high order modes will extend into those lossy layers 139 and 140. Their propagation will extinguish since their gain will not be sufficient to maintain continued propagation. On the other hand, the fundamental mode, $TE_{00}$, does not extend significantly into lossy layers 139 and 140 and maintains propagation within the LOC as confined by the low refractive index layers 137 and 138.

The prerequisite here is that layers 139 and 140 must have a refractive index greater than the equivalent refractive index of the undesirable higher order transverse modes 144 of the optical waveguide.

Figure 19:
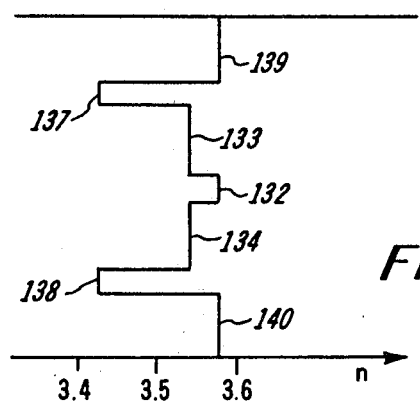
FIG. 19 is a refractive index profile for the laser structure of FIG. 18.

FIG. 19 illustrates the refractive index profile for laser 130.

Figure 20:
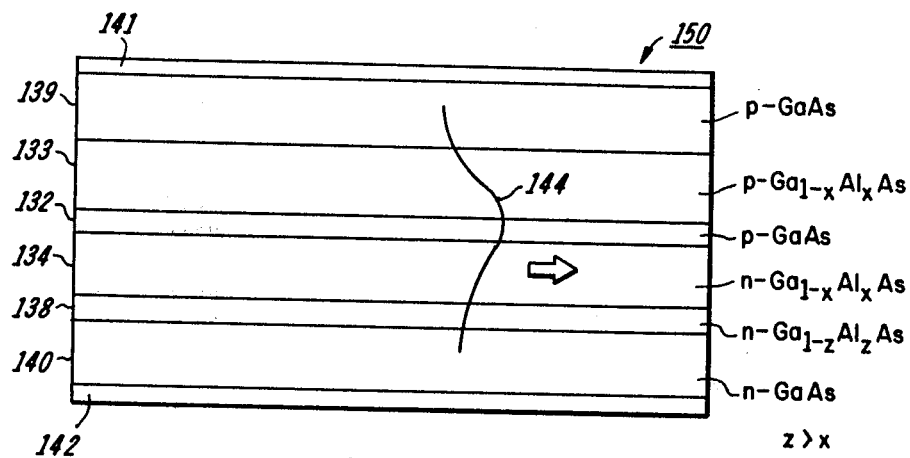
FIG. 20 is a diagrammatic illustration of a double LOC heterostructure injection laser similar to that shown in FIG. 18 except only one outer thin layer is provided for mode confinement and control.

There are many alternatives relative to LOC laser structures and the employment of thin confinement layers 137 and/or 138. In FIG. 20, only one thin such confinement layer 138 is utilized in LOC laser 150. Here, the fundamental mode, $TE_{00}$, 144 will propagate, without restriction, favoring such propagation a little off center from the center of active layer 132. Higher order modes will be extinguished by radiation into the lossy layers 139 and 140. A single confinement layer 137 or 138 can also substantially perform the desired function of extinguishing the propagation of higher order modes.

Lasers 130 and 150 may be termed as double LOCs, since the optical waveguide bounds equally on both sides of the active layer 132. Laser 160 in FIG. 21 and laser 170 in FIG. 22, however, are single LOCs, since the optical waveguide is only provided on one side of the active layer 132, i.e., waveguide layer 133 is not present and waveguide layer 134 will support optical wave propagation.

Figure 21:
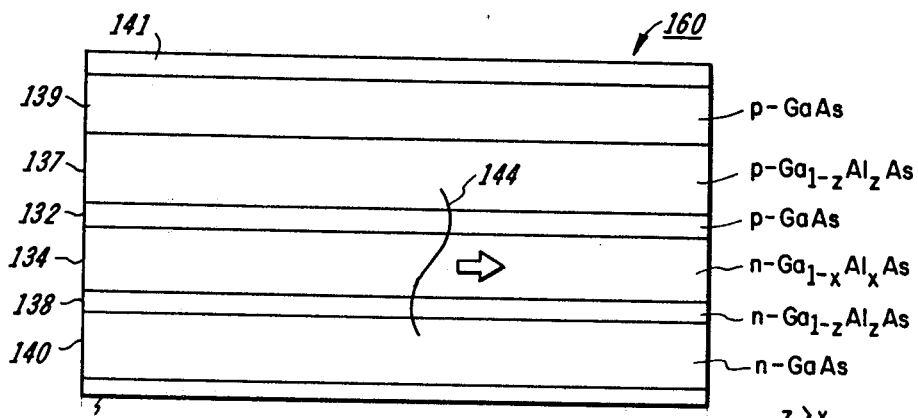
FIG. 21 is a diagrammatic illustration of single LOC heterostructure injection laser with an outer confinement layer contiguous with the LOC structure.

In FIG. 21, laser 160 has one confinement layer 138. Layer 137 may be made of thick crossection in this configuration to provide a one sided LOC.

Figure 22:
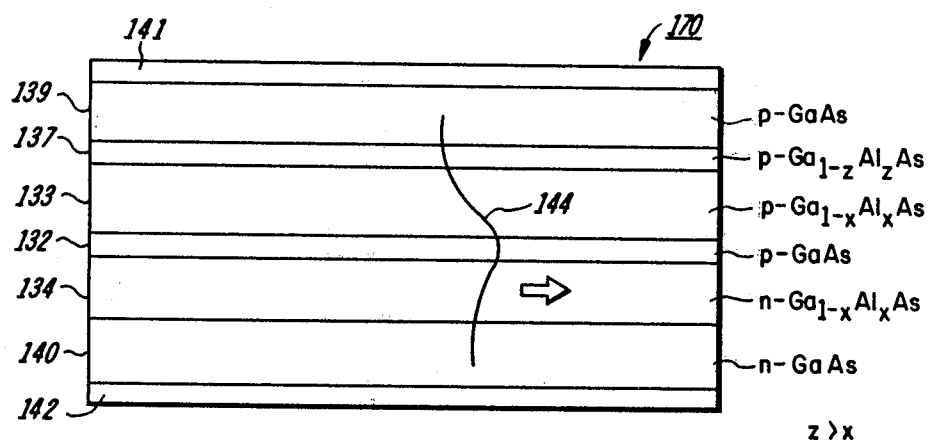
FIG. 22 is a diagrammatic illustration of a single LOC heterostructure injection laser with an outer confinement layer positioned opposite to the LOC structure.

FIG. 21, the confinement layer 138 is provided on the single LOC side of the laser 160 whereas in FIG. 22, confinement layer 137 is provided on the opposite side of laser 170 relative to the single LOC comprising layer 134.

The employment of confinement layers 137 and 138 illustrated in FIGS. 18–22 may also be applied to channel substrate planar and nonplanar laser structures previously illustrated in FIGS. 12–17.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within within the spirit and scope of the appended claims. For example, the concept of the present invention in employing thin cladding layers has wide applicability to a variety of diode laser devices, such as, stripe geometry lasers, single transverse mode lasers, and distributive feedback lasers. A low beam divergence source is provided that has a nearly symmetrical high power output beam that is easily coupled into fiber optic waveguides.

Also, other semiconducting crystalline materials, such as those containing In, Ga, Al, As, P, Sb, Pb, Sn and Te or other light emitting materials may be employed rather than GaAs:GaAlAs.

Further, the thickness and compositions shown in the figures are intended to be only indicative of actual values. In practice, these thicknesses could be outside the suggested ranges in order to optimize a particular type of behavior of the device, for example, even lower beam divergences can be obtained by fabricating layers 14, 16 and 18 to be thinner than illustrated. However, this will cause the threshold of the laser to increase due to a lack of overlap of the optical wave with the active region. Thus, for each laser design, it is necessary to calculate the necessary compositions and thicknesses to optimize a certain performance parameter.

What is claimed is:

1. In an injection laser having an active layer of narrow bandgap and high refractive index for guided optical wave propagation, said laser including at least one cladding layer contiguous with one surface of said active layer and having a substantially lower index of refraction compared to said active layer, said cladding layer of very thin cross-sectional thickness, the minimum thickness being sufficient to confine injected carriers to said active layer but permitting extension of the optical wave propagation beyond said cladding layer, a further layer contiguous with the surface of said cladding layer remote from said active layer, said further layer having an index of refraction intermediate of said active layer and said cladding layer and chosen to be lower than the equivalent refractive index of the fundamental mode of the guided optical wave.

2. In the injection laser of claim 1, the refractive index of said further layer being near to that of said active layer than the refractive index of said cladding layer.

3. In the injection laser of claims 1 or 2, a still further layer contiguous with the surfaces of said intermediate index layers remote from said active layer to improve optical confinement of the optical wave, said still further layer having an index of refraction lower than that of said further layer.

4. In the injection laser of claim 3, said still further layer being sufficiently thick to provide low optical loss for the lowest order transverse mode while being sufficiently thin to provide high optical loss for higher order transverse modes.

5. In the injection laser of claim 1, said laser including means to provide transverse mode control in a direction lateral to the parallel extent of said layers.

6. In the injection laser of claim 5, said means comprising a nonplanar, enlarged region in said intermediate layer.

7. In the injection laser of claim 6, said means further comprising a nonplanar enlarged region in said cladding layer contiguous with said intermediate layer nonplanar enlarged region.

8. In the injection laser of claim 7, said means further comprising a nonplanar enlarged region in said active layer contiguous with said cladding layer nonplanar enlarged region.

9. In the injection laser of claim 1, wherein there are cladding layers contiguous with both surfaces of said active layer and further layers contiguous with the surface of each of said cladding layers remote from said active layer, the index of refraction of said further layers being chosen to be lower than the equivalent refractive index of the fundamental mode of the guided optical wave.

10. In the injection laser of claim 9, said laser including means to provide transverse mode control in a direction lateral to the parallel extent of said layers.

11. In the injection laser of claim 10, said means comprising a nonplanar enlarged region in one or more of said active layer, at least one of said cladding layers and at least one of said intermediate layers.

12. In the injection laser of claim 9, a still further layer contiguous with the surface of each of said intermediate index layers remote from said active layer to improve optical confinement of the optical wave, said still further layers having an index of refraction lower than the refractive index of said further layers.

13. In the injection laser of claim 12, said still further layers being sufficiently thick to provide low optical loss for the lowest order transverse mode while being sufficiently thin to provide high optical loss for higher order transverse modes.

14. In the injection laser of claim 12, said laser including means to provide transverse mode control in a direction lateral to the parallel extent of said layers.

15. In the injection laser of claim 14, said means comprising a nonplanar enlarged region in one or more of said layer, at least one of said cladding layers and at least one of said intermediate layers.

16. In an injection laser having an active layer of narrow bandgap and high refractive index for guided optical wave propagation, said laser including a cladding layer provided on adjacent sides of said active layer and having a substantially lower index of refraction relative to said active layer, said cladding layers of very thin cross-sectional thickness, their minimum thickness being sufficient to confine injected carriers to said active layer but permit extension of the optical wave propagation beyond said cladding layers, a further layer provided on the surface of each of said cladding layers remote from said active layer, said further layers having a relatively large thickness compared to said cladding and active layers to confine the optical wave thereto, said further layers having an index of refraction intermediate of said active layer and said cladding layers, the index of refraction of said further layers being chosen to be lower than the equivalent refractive index of the fundamental mode of the guided optical wave.

17. In the injection laser of claim 16, the refractive index of said further layers being near that of said active layer than the refractive index of said cladding layers.

18. In the injection laser of claims 16 or 17, a still further layer contiguous with the surface of each of said intermediate index layers remote from said active layer to improve optical confinement of the optical wave, said still further layers having an index of refraction lower than the refractive index of said further layers.

19. In the injection laser of claim 18, said still further layers being sufficiently thick to provide low optical loss for the lowest order transverse mode while being sufficiently thin to provide high optical loss for higher order transverse modes.

20. In the injection laser of claims 16 or 17, a still further layer provided on the surface of one of said intermediate layers remote from said active layer to improve optical confinement of the optical wave, said still further layer having a refractive index of refraction lower than the refractive index of said further layers.

21. In an injection laser comprising a plurality of contiguous layers of semiconductor material, one of said layers fabricated to have a lower bandgap and a higher refractive index than said other layers to form an active layer for optical wave propagation under lasing conditions, said active layer being sandwiched by two first layers each of semiconductor material having a higher bandgap and a lower refractive index than said active layer, said first layers forming an optical waveguide for said optical wave propagation, a thin second layer contiguous with said first layer and a third layer contiguous with said second layer, said second layer having a higher bandgap and lower refractive index than any of said other layers, said second layer of thinner cross-sectional thickness compared to the thickness of any of the other of said layers, said second layer thickness being sufficiently thin to provide high optical loss for higher order transverse modes but sufficiently thick to provide low optical loss for the lowest order transverse mode, the refractive index of said third layer being greater than the equivalent refractive index of the higher order transverse modes of the guided optical wave.

22. In the injection laser of claim 21, wherein another of said thin second layers is contiguous with the other of said first layers, another of said third layers contiguous with said other second layer.

23. In the injection laser of claim 22, wherein one of said second layers has a cross-sectional thickness substantially in excess of the cross-sectional thickness of the other of said second layers and comparable in thickness to said first layers.

24. In the injection laser of claim 23, wherein said first layers are sandwiched by two thin second layers each of semiconductor material having a higher bandgap and lower refractive index than any of said other layers, said second layers being sandwiched by two outer third layers, said second layers of thinner cross-sectional compared to the thickness of any of the other of said layers, said second layer thickness being sufficiently thin to provide high optical loss for higher order modes but sufficiently thick to provide low optical loss for the lowest order transverse mode, the refractive indices of said third layers being greater than the equivalent refractive index of the higher order transverse modes of the guided optical wave.

25. In an injection laser comprising a plurality of contiguous layers of semiconductor material, one of said layers fabricated to have a lower bandgap and a higher refractive index than said other layers to form an active layer for optical wave propagation under lasing conditions, a first layer contiguous with one surface of said active layer and of semiconductor material having a higher bandgap and a lower refractive index than said active layer but sufficient in closeness thereto to form an applied waveguide for said optical wave propagation, said active and first layers being sandwiched by two second layers each having a higher bandgap and lower refractive index than any of said other layers, said second layers being sandwiched by two outer third layers, one of said second layers being sufficiently thin in thickness to provide high optical loss for higher order modes but sufficiently thick to provide low optical loss for the lowest order transverse mode, the refractive indices of said third layers being greater than the equivalent refractive index of the higher order transverse modes of the guided optical wave.

26. In the injection laser of claim 25 wherein both of said second layers being sufficiently thin in thickness to provide high optical loss for higher order modes but sufficiently thick to provide low optical loss for the lowest order transverse mode.

* * * * *